(12) United States Patent
Tamura et al.

(10) Patent No.: US 6,515,561 B2
(45) Date of Patent: Feb. 4, 2003

(54) CONNECTING STRUCTURE AND FREQUENCY ADJUSTING METHOD THEREIN

(75) Inventors: Takashi Tamura, Minato-ku (JP); Naoki Atsumi, Minato-ku (JP); Hiroyuki Arai, 615-11, Imajuku Higashi-cho, Asahi-ku, Yokohama-shi, Kanagawa-ken (JP); Hajime Izumi, Kisarazu (JP)

(73) Assignees: FDK Corporation, Tokyo (JP); Hiroyuki Arai, Kanagawa-ken (JP)

( * ) Notice: Subject to any disclaimer, the term of this patent is extended or adjusted under 35 U.S.C. 154(b) by 0 days.

(21) Appl. No.: 09/773,612

(22) Filed: Feb. 2, 2001

(65) Prior Publication Data

US 2002/0000902 A1 Jan. 3, 2002

(30) Foreign Application Priority Data

May 24, 2000 (JP) .......................................... 2000-153801

(51) Int. Cl.$^7$ ................................ H01P 1/04; H01P 3/08
(52) U.S. Cl. ........................ 333/246; 333/260; 333/219
(58) Field of Search ................................. 333/248, 204, 333/219, 238, 246, 260

*Primary Examiner*—Benny Lee
*Assistant Examiner*—Kimberly E Glenn
(74) *Attorney, Agent, or Firm*—Wenderoth, Lind & Ponack, L.L.P.

(57) ABSTRACT

A connecting structure for high frequency circuits is provided, with which components can be readily replaced, and which does not require high assembly accuracy and is applicable in a broad band. First and second circuit boards each having strip lines on top surfaces thereof are placed to secure a gap therebetween. Patch portions each constituting a resonator are formed by extending the width of the strip lines, and a supporting member of a foam material is placed on the top of the patch portion formed on the first circuit board. A parasitic element made of a dielectric material is cantilevered by the supporting member. The free end side of the parasitic element is placed above the patch portion formed on the second circuit board while securing a predetermined space between the parasitic element and this patch portion. A strong electrical connection is established by the parasitic element that electromagnetically couples non-continuing portions, thereby making it possible to cut a direct current.

21 Claims, 4 Drawing Sheets

CONNECTING STRUCTURE AND FREQUENCY ADJUSTING METHOD THEREIN

BACKGROUND OF THE INVENTION

1. Field of the Invention

The present invention relates to a connecting structure and a frequency adjusting method therein, and, more particularly, to improvements in a connecting structure for circuits operating at a microwave or millimeter wave frequency band.

2. Description of Relevant Art

An electrical device is produced by combining various circuits and devices, for example. Practically, circuits are installed in the electrical device by means of forming a printed circuit board for each circuit, placing the printed circuit boards on a mother board through spacers or the like, and connecting each printed circuit board to the circuit on the mother board.

Conventionally, each printed circuit board is connected to the mother board (printed circuit board) or devices with a connecting member of metal, such as a wire or a ribbon, so that conduction is established between the terminals of circuits or the like to be connected by linking both ends of the connecting member to the respective terminals electrically and mechanically by means of soldering or ultrasonics.

However, the conventional connecting structure using the above connecting member has the following problems. That is, when the connection is established with the above connecting member in the range of a microwave or a millimeter wave having a short wavelength, the circuit constant varies in response to the length and shape of the connecting member, and also in response to a quantity of soldering or the connecting position when the connecting member is bonded to the terminals, which causes the transmission state to become unstable.

Also, when the desired circuit characteristics cannot be obtained due to the foregoing causes, characteristic adjusting processes of various kinds have to be carried out by, for example, partially removing the connecting member or soldering or providing an auxiliary member. However, most of the characteristic adjusting processes rely on one's experience and involve a complicated procedure. Therefore, these processes are not suitable for mass-producing products of uniform quality.

In addition, because the terminals and connecting member are closely adhered to each other, if the circuit arrangement or devices need to be changed after manufacturing, the connecting member is cut to separate the connected printed circuit boards, and reconnected to a replaced printed circuit board or the like. This cutting procedure makes the replacement job difficult.

Further, if cuttings from the cut connecting member are not removed completely, the residual cuttings may adversely affect the circuit characteristics. Moreover, heating for adhering the connecting member, or removing the cuttings, may undesirably cause a change in the shape and dimension of the circuit pattern or separation of the same.

SUMMARY OF THE INVENTION

The present invention has been made to solve the above problems, and therefore, has as an object to provide a new connecting structure and a new frequency adjusting method in the connecting structure.

Another object of the present invention is to provide a non-contact connecting structure for high frequency circuits operating at microwave or millimeter wave frequencies, with which a connection between circuit elements can be readily established without requiring high accuracy in assembly and dimension. Also, components can be readily replaced after the connection is established while suppressing a change in the connection state that possibly occurs during replacement. The connecting structure is also stable under temperature-change and capable of protecting devices on the circuit. A further object is to provide a frequency adjusting method in such a connecting structure.

In order to achieve the above and other objects, in a first aspect of the present invention, there is provided a connecting structure for first and second high frequency circuit elements (corresponding to first and second circuit boards 2 and 3 in the embodiment discussed below) each provided with a dielectric substrate having a transmission line (corresponding to strip lines 4a and 4b in the embodiment) made out of a conductive film on a top surface thereof. The first and second high frequency circuit elements are placed in such a manner as to secure a predetermined gap therebetween. A connecting terminal pattern (corresponding to patch portions 5a and 5b in the embodiment described below) constituting a resonator is formed continuously with the transmission line on the top surface of the high frequency circuit elements, and a supporting member is placed on a top surface of the connecting terminal pattern formed on the first high frequency circuit element. A parasitic element made of a dielectric material is cantilevered by the supporting member, and a free end side of the parasitic element is placed above the connecting terminal pattern formed on the second high frequency circuit element while securing a predetermined space between the parasitic element and the connecting terminal pattern on the second high frequency circuit element.

The high frequency circuit element referred to herein means literally an element used in a high frequency circuit, and concrete examples include a circuit board such as a printed circuit board, and other devices. Also, the high frequency referred to in the present invention means the frequency of a microwave or a millimeter wave, for example, and may be an even higher frequency.

The experimental results reveal that when the parasitic element is cantilevered by the supporting element as above such that both ends of the parasitic element are overlaid on the two connecting patterns that will be connected, impedance matching can be achieved in a broad band, which results in a satisfactory connection state within in a high frequency range. This is because a high frequency signal is allowed to propagate due to electromagnetic coupling between the connecting terminal patterns (resonators) and parasitic element.

In the case that the circuits forming the circuit elements are connected, or the circuit and device are connected, processing tolerance and assembly tolerance make it quite difficult to complete assembly while securing an exact gap as designed, which causes a gap between the elements to vary. In the present invention, however, by using the parasitic element, the coupling is enhanced and the passing band is broadened, thereby making it possible to maintain a stable transmission state even when the gap varies to some degree.

Further, because a space is formed between at least the free end of the parasitic element and connecting terminal pattern, a capacitor is formed across this space. Thus, even if static electricity or an abnormal potential, such as a surge, is propagated onto the circuit, it is cut at the connecting structure of the present invention, and will not be propagated extensively to the subsequent stages. Moreover, because the second high frequency circuit element and parasitic element are not fixed to each other, replacement at the second high frequency circuit element side is particularly easy.

Furthermore, because the parasitic element is cantilevered, and therefore, is not directly fixed to the second high frequency circuit element, the transmission line (circuit pattern) made out of the conductive film will not be separated due to stress that occurs as a result of heat contraction in response to a temperature change.

The supporting member may have a high dielectric constant. However, according to a second aspect of the present invention, it is preferable that the supporting member is made of a material having a low dielectric constant. The material having a low dielectric constant referred to herein means a material having a dielectric constant lower than that of the dielectric substrate. Besides those generally referred to as the materials having a low dielectric constant, materials having a dialectic constant greater than 1 and not greater than 3 are preferable.

By using the material having a low dielectric constant, loss in the supporting member can be reduced. Also, one end of the parasitic element is fixed onto the material having a low dielectric constant while the parasitic element and connecting terminal patterns are electromagnetically coupled in a secure manner. This further ensures the effect of suppressing variation in characteristics in response to positional displacement of the connected portion that possibly occurs during replacement of the circuit and device.

In addition, examples of the material having a low dielectric constant include glass and other various kinds of materials. However, according to a third aspect of the present invention, it is preferable that the material having a low dielectric constant is a foam material (urethane foam in the embodiment). Because the foam material has resilience, it can also function as a buffer. In other words, if the parasitic element and the high frequency circuit elements have different coefficients of thermal expansion, differences in thermal expansion and contraction in response to a temperature change are absorbed by the supporting member and will not be delivered to the other. Consequently, no stress is generated at the connected portion in response to a temperature change, and separation of the transmission line can be prevented as much as possible.

Further, according to a fourth aspect of the present invention, it is advantageous that a length of the resonator is ¼ of an effective wavelength ($\lambda_g$). In other words, when the parasitic element is cantilevered, the length of the resonator can be set not to $\lambda/2$ but to $\lambda/4$, thereby making it possible to downsize the entire circuit substrate. It should be appreciated, however, that the length does not have to be exactly ¼, and may be slightly larger or smaller than ¼ as long as desired transmission characteristics can be achieved. In short, the idea discussed herein is approximation to ¼, with which substantially the same effect can be achieved.

The parasitic element can be made of resin and other various kinds of materials. However, according to a fifth aspect of the present invention, it is preferable that the parasitic element is made out of a ceramic substrate. In other words, when ceramic is used, the dimension and shape vary so little that the transmission state is stabilized and a change in the transmission state between the products can be suppressed. Further, because most of the dielectric substrates are based on alumina, by employing the ceramic substrate (alumina, for example), there can be expected an effect that substantially the same coefficient of thermal expansion is given to both the parasitic element and circuit boards.

According to a sixth aspect of the present invention, it is preferable that substantially the same coefficient of thermal expansion is given to the parasitic element and dielectric substrate. When the coefficients of thermal expansion are equal, even if a temperature changes during manufacturing or actual use, occurrence of stress at the connected portion through the supporting member can be suppressed as much as possible. Consequently, separation of the transmission line can be prevented effectively. Thus, it should be understood that the term "substantially the same" means a range in which the above discussed effect can be achieved, and the idea discussed herein may allow a slight difference in the coefficients of thermal expansion between the parasitic element and dielectric substrate.

Further, according to a seventh aspect of the present invention, it is advantageous that substantially the same resonance frequency is set in the parasitic element and the connecting terminal pattern. When arranged in this manner, the electromagnetic coupling at the used frequency, and hence the transmission characteristics, can be enhanced.

In addition, according to an eighth aspect of the present invention, it is advantageous that a length of the parasitic element is between or equal to 1.4 and 1.5 times greater than a length of the connecting terminal pattern.

In other words, in the case that the dielectric substrate and parasitic element are made of the same material, such as alumina, or the materials have substantially the same dielectric constant, it is preferable to set the length of the parasitic element between or equal to 1.4 and 1.5 times greater as described above, because by so doing, the electromagnetic coupling is enhanced. The present invention is used in connecting the circuits and devices, and for this reason, deterioration of impedance at the connected portion has to be suppressed. Thus, it is preferable to set the length in the above range, because the return loss of approximately −20 dB can be secured. It should be appreciated that when the specifications covering the required characteristics are less restrictive, the length may be outside the above range (between or equal to 1.4 and 1.5 times greater), and there is no problem in practical use when the set length is outside the above range.

A ninth aspect of the present invention provides a frequency adjusting method of the connecting structure according to any of the first through seventh aspects, wherein a used frequency is adjusted by changing the length of the parasitic element employed.

In other words, the experimental results have revealed that changing the length of the parasitic element causes displacement of the central frequency. The connecting structure of the present invention must meet the demands that it can be used not only in a broad frequency band, but also under the circumstances where the most satisfactory characteristics are achieved. In addition, the frequency may be displaced to the outside of the broad band for some reason. Thus, under these circumstances, the length of the parasitic element is changed to displace the central frequency, so that the desired transmission characteristics can be achieved.

The length can be changed in various manners, for example, by preparing a plurality of the parasitic elements of different lengths and choosing the optimal one, or removing or cutting a part of the parasitic element after it is attached. In the case of preparing a plurality of the parasitic elements of different lengths, the parasitic element is temporarily attached one by one and the characteristics are measured for each until the desired characteristics are achieved. Once the desired characteristics are achieved, the temporarily attached parasitic element is employed and attached properly. In particular, the characteristics vary per lot unit when the high frequency circuit elements or the like are manufactured. Thus, prior to the assembly using a new lot, the characteristics may be checked by the above temporal attachment to determine a desired length, so that the parasitic element having the length thus determined is used for assembly using that lot.

For a fuller understanding of the nature and advantages of the invention, reference should be made to the ensuing detailed description taken in conjunction with the accompanying drawings.

DETAILED DESCRIPTION OF THE PREFERRED EMBODIMENTS

Figure 1:
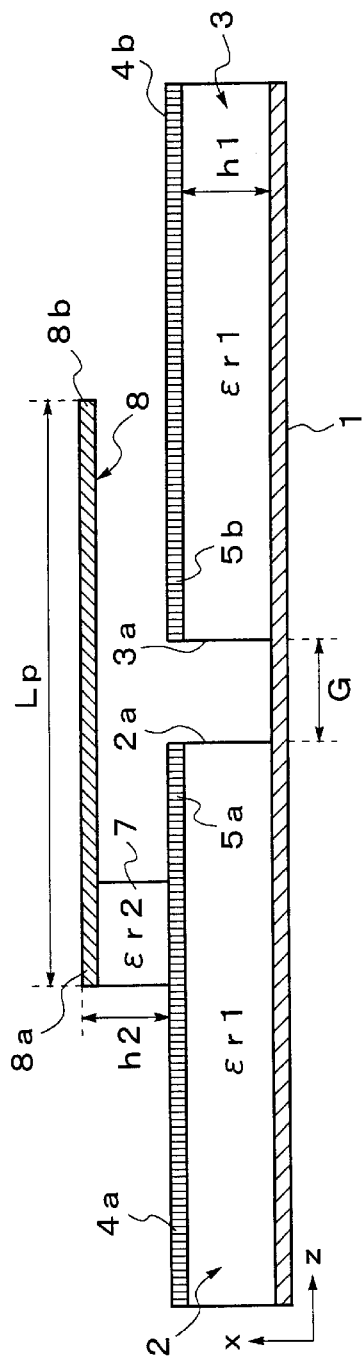
FIG. 1 is a front view showing one preferred embodiment of the present invention.
Figure 2:
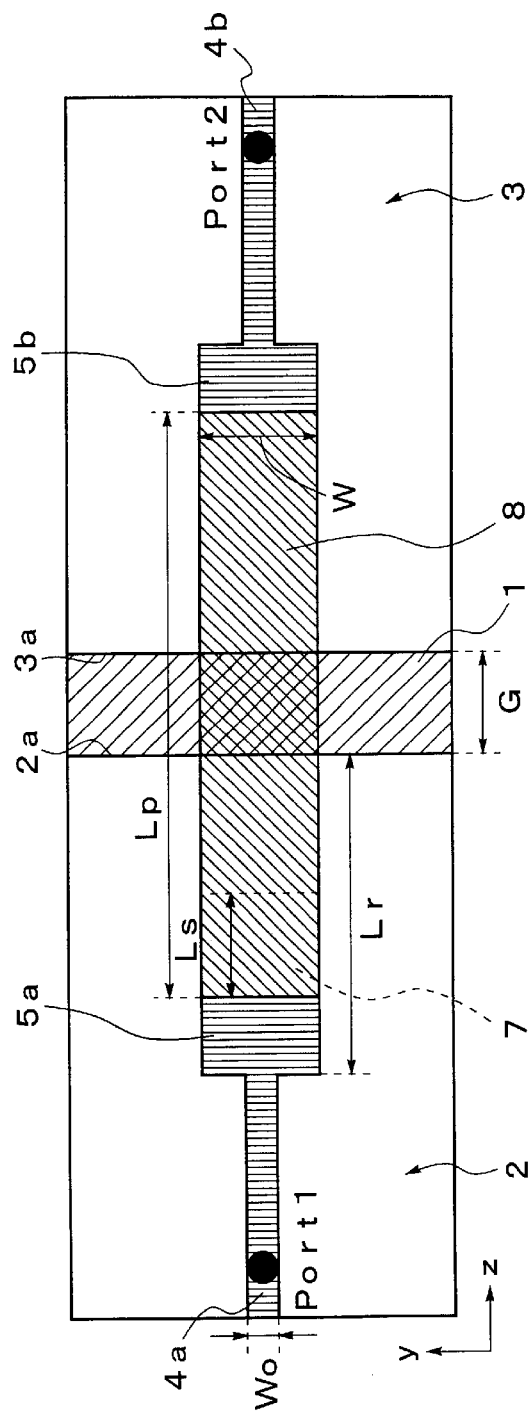
FIG. 2 is a plan view showing one preferred embodiment of the present invention.

FIGS. 1 and 2 are views showing one preferred embodiment of the present invention. As shown in the drawings, first and second circuit boards 2 and 3 are placed on a base plate (metal plate) 1 in such a manner as to secure a certain gap G therebetween. The first and second circuit boards 2 and 3 are made of a dielectric material, such as alumina, and transmission lines made out of a conductive film, namely, strip lines 4a and 4b of a predetermined circuit pattern, are formed thereon. In the figures, only the connected portion is illustrated, but it should be appreciated that the actual first and second circuit boards 2 and 3 include areas not shown in the figures. Alternatively, the base plate 1 may be prepared separately, so that each of the first and second circuit boards 2 and 3 is installed fixedly thereon, or one of the circuit boards may be formed as an integral part of the base plate 1, so that the other circuit board is placed thereon.

The first and second circuit boards 2 and 3 are provided with patch portions 5a and 5b, respectively, which will be connected to the strip lines 4a and 4b continuously and made into connected potions. Each of the patch portions 5a and 5b is a rectangle, and constitutes a resonator by making the width W three times greater than the width W0 of the strip lines 4a and 4b that form 50 Ω lines, and setting the length Lr to approximately $\lambda_g/4$ of the used frequency. Here, $\lambda_g$ an effective wavelength with consideration given to a dielectric constant of the dielectric material out of which the circuit boards 2 and 3 are made. Also, the top ends of the patch portions 5a and 5b are contacted with opposing edges 2a and 3a of the first and second circuit boards 2 and 3, respectively, and the patch portions 5a and 5b are aligned in the same straight line.

In the present invention, a connection between the two patch portions 5a and 5b is established. More specifically, in the first place, a supporting member 7 is fixed onto the patch portion 5a at the first circuit board 2 side, and a strip of a parasitic element 8 is cantilevered through the supporting member 7. In other words, the parasitic element 8 is fixedly held onto the top surface of the supporting member 7 at one end 8a, while having the other end 8b as a free end. The parasitic element 8 is placed above both the patch portions 5a and 5b so as to overlay the same.

Thus, by adequately setting the length of the parasitic element 8, the other end 8b serving as the free end of the parasitic element 8 is placed above the patch portion 5b at the second circuit board 3 side while leaving a space between the parasitic element 8 and patch portion 5b. Consequently, the parasitic element 8 is electrically isolated from the patch portion 5b and hence the strip line 4b, thereby cutting a supply of a direct current. Here, the length $L_p$ of the parasitic element 8 is approximately 1.5 times greater than the length $L_r$ of the patch portions 5a and 5b.

The supporting member 7 is formed to contact a part of the patch portion 5a, but it may be formed to contact the patch portion 5a entirely. In this case, the supporting member 7 may be of the identical shape as that of the patch portion 5a, or it may be larger.

In the above embodiment, the same width is given to all the patch portions 5a and 5b, supporting member 7, and parasitic element 8, so that these members overlay one another. It should be appreciated, however, that the present invention is not limited to the foregoing arrangement, and the foregoing members may be displaced a little to partially overlap one another. The experimental results revealed that when the foregoing members are displaced in the width direction, desired characteristics can be obtained if the parasitic element 8 overlaps half the patch portions 5a and 5b. Further, the patch portions 5a and 5b are not necessarily aligned in the same line.

The materials from which the supporting member 7 and parasitic element 8 will be made are prerequisite to the present invention. The supporting member 7 is made of a foam material, such as urethane foam ($\epsilon_r$=1.04 to 1.1). Because the foam material has a low dielectric constant and loss is small therein, electromagnetic coupling between the patch portions 5a and 5b and parasitic element 8 is enhanced.

The parasitic element 8 is composed of a ceramic substrate, and more concretely, made of alumina. The dielectric substrates forming the circuit boards 2 and 3 are also made of alumina, and it is readily understood that the parasitic element 8 and circuit boards 2 and 3 can be made of the same material and have the same dielectric constant. Alternatively, other materials, such as Teflon®, can be used instead of alumina.

The patch portions (resonators) 5a and 5b, when arranged in the above manner, are electromagnetically coupled to the parasitic element 8, which allows propagation of a high frequency signal, thereby forming a non-contact electromagnetically coupled connector. In other words, in the case that a signal propagates from the first circuit board 2 side, a current is fed from the Port 1 and the patch portion 5a functioning as a transmitting antenna radiates a high frequency signal (microwave/millimeter wave). The high frequency signal thus radiated propagates to the parasitic element 8 and reaches the patch portion 5b functioning as a receiving antenna, whereby a signal is transmitted.

Figure 3:
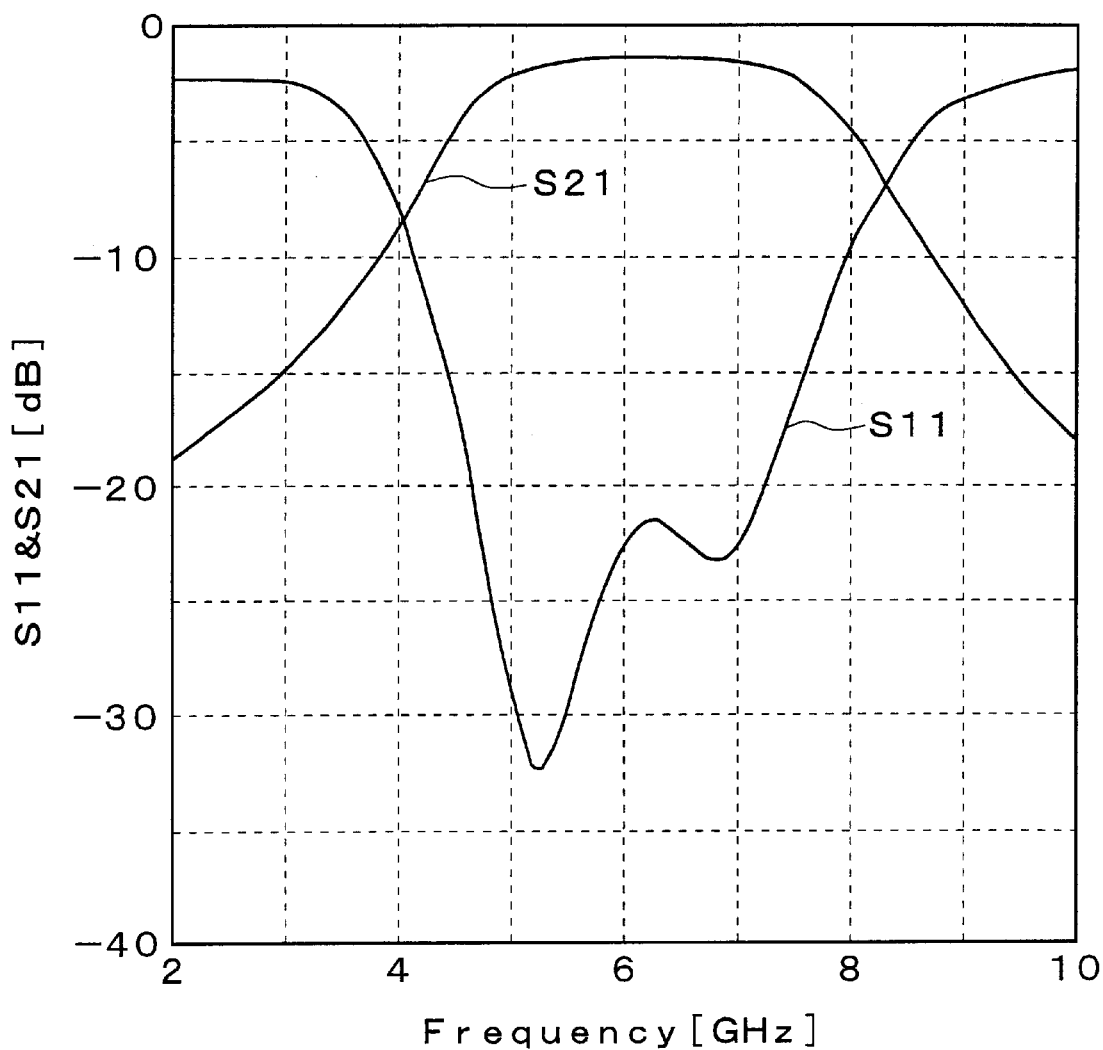
FIG. 3 is a view showing an example of transmission characteristics.

FIG. 3 shows an example transmission state in the foregoing arrangement. As is shown in the figure of the drawing, because the electromagnetic coupling between the patch portions 5a and 5b and parasitic element 8 is strong, a broad band is secured as transmissible frequency band with passing loss S21 of 0 dB. Also, the return loss in almost the entire range is −20 dB or greater at the passing loss S21 of 0 dB. This reduces a change in the transmission state of the circuit in response to variance of the center frequency. Consequently, a change in the transmission state of the circuit can be suppressed even if the gap G between the connected circuit boards 2 and 3 changes and the relative location or dimensional shape varies.

Figure 4:
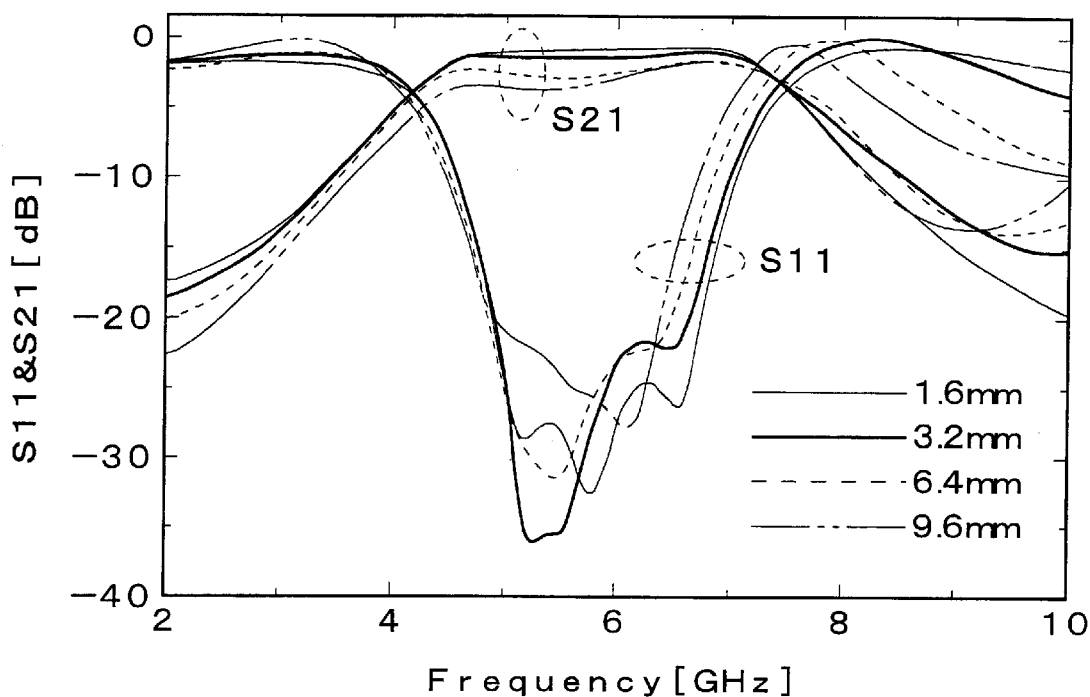
FIG. 4 is a view showing an effect of a gap between circuit boards with respect to the transmission characteristics.

FIG. 4 shows a change in transmission characteristics in response to a change in the gap G between the first and second circuit boards 2 and 3. The dielectric constant $\epsilon_{r1}$ of the first and second circuit boards 2 and 3, the dielectric constant $\epsilon_{r2}$ of the supporting member 7, the length $L_r$ of the first and second patch portions 5a and 5b, the length $L_s$ of the supporting member 7, the length $L_p$ of the parasitic element 8, the width W of the first and second patch portions 5a and 5b, supporting member 7, and parasitic element 8, the thickness h1 of the first and second circuit boards 2 and 3, and the thickness h2 of the supporting member 7 are set forth in Table 1 below. Here, the first and second circuit boards 2 and 3, and parasitic element 8 are made of Teflon®.

TABLE 1

| $\epsilon_{r1}$ | $\epsilon_{r2}$ | $L_r$ | $L_s$ | $L_p$ | W | h1 | h2 |
|---|---|---|---|---|---|---|---|
| 2.1 | 1.1 | 16 | 1.2 | 22.4 | 5.057 | 0.795 | 0.795 |

(Unit of length: mm)

FIG. 4 reveals that a stable transmission state can be secured when the gap is as wide as 6.4 mm, that is, approximately $\lambda_g/10$.

Figure 5:
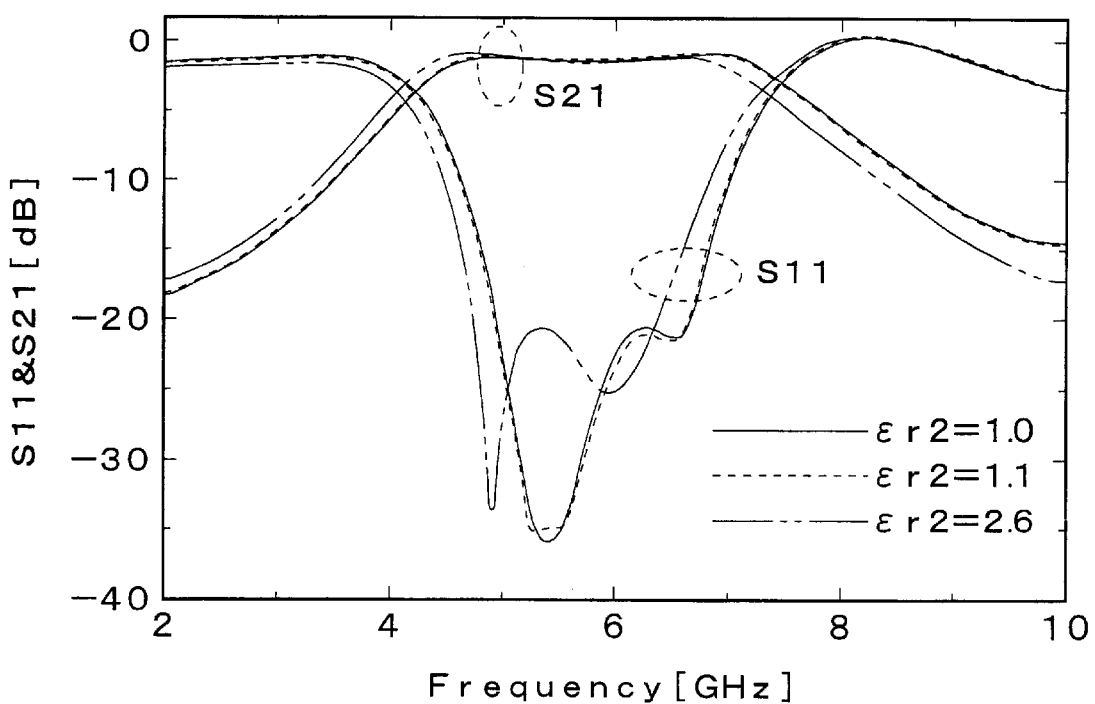
FIG. 5 is a view showing an effect of a dielectric constant of a supporting member with respect to the transmission characteristics.

FIG. 5 shows the transmission characteristics in response to a change in the dielectric constant $\epsilon_{r2}$ of the supporting member 7. The parameters other than the dielectric constant $\epsilon_{r2}$ are the same as those set forth in Table 1 above. FIG. 5 reveals that the characteristics do not vary noticeably and remain satisfactory even when the dielectric constant $\epsilon_{r2}$ increases approximately as large as 2.6. This indicates that even when the dielectric constant of the supporting member 7 supporting the parasitic element 8 varies in response to a change in ambient temperature, the supporting member 7 can absorb the effect of the change. It should be noted, however, that the smaller the dielectric constant $\epsilon_{r2}$, the better the characteristics become.

Although the experimental results are not specifically shown in the drawing, it is also confirmed that when a gap as wide as 8 mm was provided and the transmission characteristics were deteriorated, it was possible to improve the deteriorated characteristics to the desired level by changing the length of the parasitic element 8. Thus, if a plurality of parasitic elements of different lengths are prepared and the transmission characteristics are measured repetitively by temporarily attaching the parasitic elements one by one until the desired characteristics are achieved, then, by employing and attaching the one with the desired characteristics properly, the frequency can be adjusted and a highly accurate connecting structure can be obtained. Alternatively, instead of preparing a plurality of parasitic elements, one parasitic element of a sufficient length may be prepared, so that the frequency is adjusted by partially cutting the same.

Figure 6:
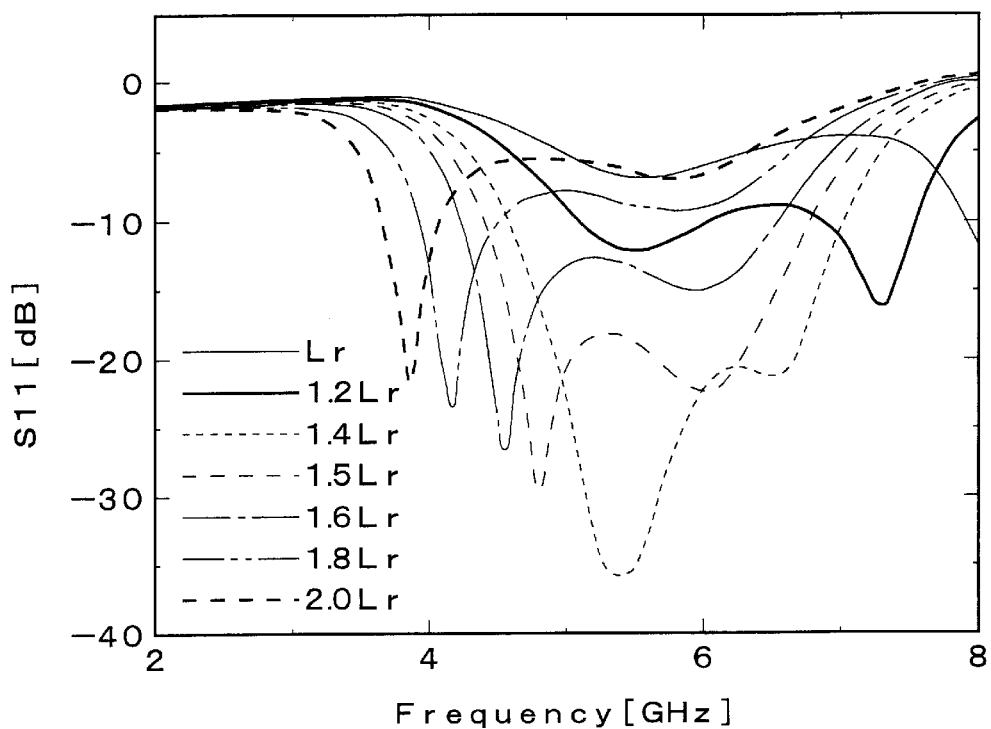
FIG. 6 is a view showing an effect of a length of a parasitic element with respect to the transmission characteristics.
Figure 7:
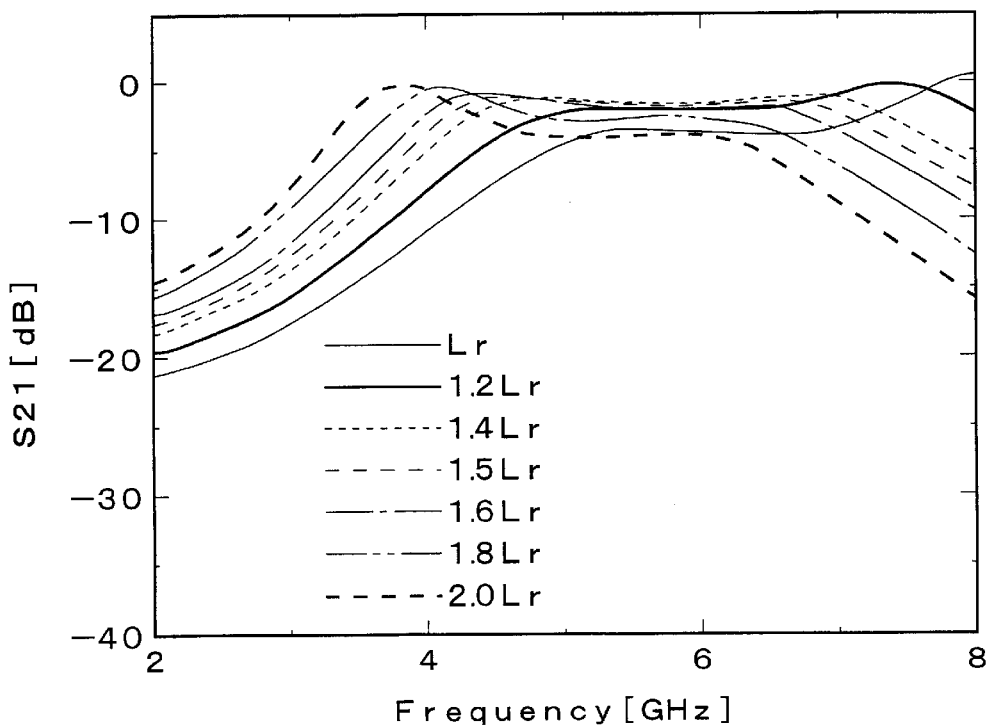
FIG. 7 is another view showing an effect of a length of the parasitic element with respect to the transmission characteristics.

FIGS. 6 and 7 show the transmission characteristics in response to a change in length of the parasitic element 8 with respect to the first and second patch portions 5a and 5b (the designed center frequency is 5 GHz). The other basic parameters are set forth in Table 2 below.

TABLE 2

| $\epsilon_{r1}$ | $\epsilon_{r2}$ | $L_r$ | $L_s$ | W | h1 | h2 |
|---|---|---|---|---|---|---|
| 2.6 | 1.0 | 16 | 1.2 | 5.0 | 0.8 | 0.8 |

(Unit length: mm)

FIGS. 6 and 7 reveal that the most satisfactory characteristics were achieved when the length of the parasitic element 8 is 1.4 times greater than that of the patch portions 5a and 5b. When it is considered that the return loss of −20 dB has to be secured, it can be understood that the satisfactory characteristics are achieved when the length is between 1.4 and 1.5 times greater.

As has been discussed above, according to the connecting structure and the frequency adjusting method in such a connecting structure of the present invention, not only can components be replaced readily in high frequency circuits operating at the microwave or millimeter wave frequencies, but also a change in the connection state that possibly occurs during replacement of devices can be suppressed. Further, because the parasitic element is cantilevered and a direct current is cut, the devices on the circuit can be protected. In addition, by making the supporting member out of a foam material, the connecting structure can be stabilized against temperature-change.

While preferred embodiments of the present invention have been described using specific terms, such description is for illustrative purposes, and it is to be understood that changes and variations may be made without departing from the spirit or scope of the following claims.

What is claimed is:

1. A connecting structure for first and second high frequency circuit elements, the first and second high frequency circuit elements each including a dielectric substtate having on a top surface thereof a transmission line in the form of a conductive film and a connecting terminal pattern constituting a resonator that is continuous with the transmission line, and the first and second high frequency circuit elements defining a gap therebetween, said connecting structure comprising:

a supporting member on a top surface of the connecting terminal pattern that is on the first high frequency circuit element; and a dielectric parasitic element extending from said supporting member in a cantilevered manner across the gap such that a free end of said dielectric parasitic element is located above and spaced from the connecting terminal pattern that is on the second high frequency circuit element.

2. The connecting structure according to claim 1, wherein a length of each of the resonators is ¼ of an effective wavelength.

3. The connecting structure according to claim 1, wherein said dielectric parasitic element comprises a ceramic substrate.

4. The connecting structure according to claim 1, wherein the dielectric substrates and said dielectric parasitic element each have substantially the same coefficient of thermal expansion.

5. The connecting structure according to claim 1, wherein said dielectric parasitic element and the connecting terminal patterns each have substantially the same resonance frequency.

6. The connecting structure according to claim 1, wherein a length of said dielectric parasitic element is within the range from 1.4 to 1.5 times a length of each of the connecting terminal patterns.

7. The connecting structure according to claim 1, wherein said supporting member comprises a material having a dielectric constant that is less than a dielectric constant of the dielectric substrates.

8. The connecting structure according to claim 7, wherein a length of each of the resonators is ¼ of an effective wavelength.

9. The connecting structure according to claim 7, wherein said dielectric parasitic element comprises a ceramic substrate.

10. The connecting structure according to claim 7, wherein the dielectric substrates and said dielectric parasitic element each have substantially the same coefficient of thermal expansion.

11. The connecting structure according to claim 7, wherein said dielectric parasitic element and the connecting terminal patterns each have substantially the same resonance frequency.

12. The connecting structure according to claim 7, wherein a length of said dielectric parasitic element is within the range from 1.4 to 1.5 times a length of the connecting terminal patterns.

13. The connecting structure according to claim 7, wherein said material having a dielectric constant that is less than a dielectric constant of the dielectric substrates comprises a foam material.

14. The connecting structure according to claim 13, wherein a length of each of the resonators is ¼ of an effective wavelength.

15. The connecting structure according to claim 13, wherein said dielectric parasitic element comprises a ceramic substrate.

16. The connecting structure according to claim 13, wherein the dielectric substrates and said dielectric parasitic element each have substantially the same coefficient of thermal expansion.

17. The connecting structure according to claim 13, wherein said dielectric parasitic element and the connecting terminal patterns each have substantially the same resonance frequency.

18. The connecting structure according to claim 13, wherein a length of said dielectric parasitic element is within the range from 1.4 to 1.5 times a length of each of the connecting terminal patterns.

19. A method of adjusting a frequency of a connecting structure for first and second high frequency circuit elements, wherein said first and second high frequency circuit elements each includes a dielectric substrate having on a top surface thereof a transmission line in the form of a conductive film and a connecting terminal pattern constituting a resonator that is continuous with the transmission line, said first and second high frequency circuit elements define a gap therebetween, and said connecting structure includes (i) a supporting member on a top surface of said connecting terminal pattern that is on said first high frequency circuit element, and (ii) a dielectric parasitic element extending from said supporting member in a cantilevered manner across said gap such that a free end of said dielectric parasitic element is located above and spaced from said connecting terminal pattern that is on said second high frequency circuit element, said method comprising:

adjusting an effective length of said dielectric parasitic element.

20. The method according to claim 19, wherein said supporting member comprises a material having a dielectric constant that is less than a dielectric constant of said dielectric substrates.

21. The method according to claim 20, wherein said material having a dielectric constant that is less than a dielectric constant of said dielectric substrates comprises a foam material.

* * * * *